(12) United States Patent
Katschorek et al.

(10) Patent No.: US 7,476,493 B2
(45) Date of Patent: Jan. 13, 2009

(54) EXPOSURE STATION FOR FILM WEBS

(75) Inventors: Haymo Katschorek, Obermichelbach (DE); Mathias Seitz, Buckenhof (DE)

(73) Assignee: Leonhard Kurz GmbH & Co. KG, Furth (DE)

( * ) Notice: Subject to any disclaimer, the term of this patent is extended or adjusted under 35 U.S.C. 154(b) by 588 days.

(21) Appl. No.: 10/562,418

(22) PCT Filed: Jul. 1, 2004

(86) PCT No.: PCT/DE2004/001398

§ 371 (c)(1),
(2), (4) Date: Dec. 27, 2005

(87) PCT Pub. No.: WO2005/006075

PCT Pub. Date: Jan. 20, 2005

(65) Prior Publication Data

US 2007/0095465 A1 May 3, 2007

(30) Foreign Application Priority Data

Jul. 4, 2003 (DE) ................. 103 30 421

(51) Int. Cl.
*B23K 26/16* (2006.01)
(52) U.S. Cl. .................... 430/347; 430/5; 430/945
(58) Field of Classification Search ............. 430/347, 430/5, 945

See application file for complete search history.

(56) References Cited

U.S. PATENT DOCUMENTS

| | | | |
|---|---|---|---|
| 3,685,906 A | 8/1972 | Raterman | |
| 5,003,915 A | 4/1991 | D'Amato et al. | |
| 5,083,850 A | 1/1992 | Mallik et al. | |
| 5,624,773 A | 4/1997 | Pforr et al. | |
| 5,633,123 A * | 5/1997 | Hill et al. | 430/347 |
| 5,933,219 A | 8/1999 | Unno | |
| 6,440,277 B1 | 8/2002 | D'Amato | |
| 2003/0031938 A1 | 2/2003 | Singh et al. | |
| 2003/0039923 A1 | 2/2003 | Mangat et al. | |

FOREIGN PATENT DOCUMENTS

DE  2513501 A1  9/1976

(Continued)

*Primary Examiner*—Kiet T Nguyen
(74) *Attorney, Agent, or Firm*—Hoffman & Baron, LLP

(57) ABSTRACT

The invention relates to an illuminating station for the production of partially designed areas in one or more layers of a web of sheeting and to optically variable elements produced with such an illuminating station and possessing partially designed areas showing different optical properties. The illuminating station has one or more radiation sources for illuminating the sheeting. The illuminating station has, further, a masking tape having partially designed areas showing different optical properties, which masking tape is guided through an illuminating zone in the path of radiation between said one or more radiation sources and the web of sheeting. The illuminating station further has two or more guide means for guiding the masking tape and/or for guiding the web of sheeting, which guide means are arranged such that the masking tape is guided in the illuminating zone in parallel relationship relative to the sheeting. Furthermore, the illuminating station has coupling means for causing the masking tape and the web of sheeting to travel through the illuminating zone at the same speed.

22 Claims, 4 Drawing Sheets

| | FOREIGN PATENT DOCUMENTS | | |
|---|---|---|---|
| DE | 2136352 A | 9/1984 |
| DE | 4211242 A1 | 12/1992 |
| DE | 4329803 A1 | 3/1994 |
| EP | 1407897 A1 | 4/2004 |
| GB | 580315 | 9/1946 |
| GB | 732866 | 6/1955 |
| JP | 5216207 | 8/1993 |
| JP | 9120154 | 5/1997 |

* cited by examiner

EXPOSURE STATION FOR FILM WEBS

CROSS REFERENCE TO RELATED APPLICATIONS

This application is a National Phase application of International Application No. PCT/DE2004/001398 filed Jul. 1, 2004, which claims priority based on German Patent Application No. 103 30 421.5, filed Jul. 4, 2003, which are both incorporated herein by reference.

BACKGROUND OF INVENTION

The invention relates to an illuminating station for the manufacture of partially designed areas in one or more layers of a web of sheeting, which station has one or more radiation sources for illuminating the web of sheeting. The invention also relates to a security element having partially designed areas and produced using such an illuminating station.

Laminated sheeting having partially demetallized layers have diverse application possibilities. They can, for example, be used for decoration of the surface of substrates or alternatively for security purposes, eg for securing documents, cards, and bank notes.

GB 2.136.352A describes the use of such laminated sheeting for security purposes, and in this case partial demetallization is achieved by overprinting a thin layer of varnish prior to actual demetallization.

In this case, the laminated sheeting serves as a seal, which is applied to two surfaces. If, following application of the seal, these two surfaces are separated from each other, for example if a package containing a video cassette is opened, this seal is destroyed and thus provides proof of the fact that the package has been opened.

This security product is produced as follows.

A plastics sheet of transparent polyester is printed with a layer of varnish. The layer of varnish thus formed is then embossed with a security hologram. The next step comprises overall metallization of the surface, in which the security hologram has been embossed. Partial demetallization of this surface is then carried out.

Partial demetallization is achieved by printing a protective varnish onto those areas of the thin metal layer which are to remain after demetallization. Then the actual demetallization is carried out, during which process only those areas of the thin metal layer are removed which are not protected by the layer of varnish.

Demetallization is then followed by a washing process. In the subsequent steps, an adhesive layer is applied, and the resulting laminated sheeting is cut into small pieces, each of which can assume the function of the aforementioned seal.

DE 43 29 803 A1 describes a masked projection illuminator for the illumination of objects in a lithography process during the production of semi-conductor elements. A photoresist layer is applied to a quartz wafer in a layer thickness of from 0.1 µm to 1 µm. The quartz wafer is now illuminated through a grid mask. The grid mask comprises a grid mask support and a lattice structure formed thereon. The grid mask support consists of quartz, soda-lime glass, or borosilicate glass. The lattice structure is produced using a photoresist, by the use of a glass layer spattered onto the substrate, or by applying a texture to the rear side of a grid mask support of glass.

SUMMARY OF THE INVENTION

It is at object of the present invention to improve illuminating processes.

This object is achieved by an illuminating station for the production of partially designed areas in one or more layers of web of sheeting, in which the illuminating station has one or more radiation sources to effect illumination of the web of sheeting and also a masking tape having partially designed areas with different optical properties, and also has two or more guide means for guiding the masking tape and/or for guiding the web of sheeting, which guide means are disposed such that the masking tape is guided through an illuminating zone in the path of radiation between said one or more radiation sources and the web of sheeting. The masking tape is guided in the illuminating zone preferably in a direction parallel to the web of sheeting. An alternative possibility is to guide the masking tape at right angles to or at an angle to the web of sheeting (transverse or slanting illumination) and to provide coupling means to effect movement of the masking tape through the illuminating zone at the same speed as that of the web of sheeting.

The invention provides a large number of advantages:

It makes it possible to produce partially designed areas in one or more layers of a web of sheeting in a continuous production flow from reel to reel by means of a single illumination step. By this means the number of the process steps for the production of such a web of sheeting is reduced and the manufacturing process is accelerated and made less expensive. Furthermore, is it possible to form partially designed areas with a high degree of precision and at high resolution even when operating at high processing rates.

The advantages gained are that the invention allows for flexible production (personalization) of partially demetallized areas and for flexible illumination of the photoresist for personalization purposes.

Embodiments of the invention are defined in the subclaims.

It is an advantage when the illuminating station has an insetting system, which regulates the position of the masking tape relatively to the sheeting in such a manner, that illumination is carried out in register. Such a device obviates the need for manually setting and resetting the illuminating station and the illuminating results attained are of consistently high quality.

The masking tape used can be an endless web or an open masking tape guided from reel to reel. Particularly when an open masking tape is used, there is the advantage that the masking tape can be provided with personalized patterned regions so that personalization of security elements can be carried out by means of the illuminating station. Thus the masking tape can be printed with, for example, individually varying data (pictures, numbers, codes). The printing process used for this purpose is preferably a digital printing process such as ink-jet or laser printing. Alternatively, the TTF printing method can be used for printing the masking tape. Another possibility is to apply varying data to the masking tape by means of laser irradiation (bleaching, blackening, laser ablation).

The use a rewritable masking tape can yield certain advantages. Such a masking tape has, for example, a layer of a thermochromic material.

It is advantageous when the illuminating station has a tensioning device for tensioning the masking tape. Such a tensioning device ensures reliable movement of the masking tape and thus improves the quality of the elements produced by means of the illuminating station.

In a preferred embodiment of the invention, the coupling means comprises at least one roller, over which the web of sheeting and the masking tape are guided in superposed relationship so that the masking tape is transported together with the web of sheeting. This makes it possible to provide a particularly cheap and simple design of the illuminating station. Particularly precise coupling of the motion of the masking tape with that of the web of sheeting is in this case attained in that two rollers for guiding the sheeting and the masking tape are provided on each side of the illuminating zone and two further rollers are provided on each side of the illuminating zone for guiding the masking tape and for achieving a contact pressure between the masking tape and sheeting.

According to another preferred embodiment of the invention, the illuminating station has a driving system for moving the masking tape at a speed. Furthermore, the coupling means is composed of a control device for regulating a driving system, which control device synchronizes the said first speed with the speed of the sheeting. In addition to the use of mechanical coupling means it is accordingly also possible to use electronic coupling means for synchronizing the speed of the masking tape with the speed of the sheeting. Such "electronic" coupling means requires that the illuminating station be equipped with additional components, which increases the cost of construction of the illuminating station. On the other hand, a number of technical advantages are gained by such means. Firstly there is no need for direct contact between the web of sheeting and the masking tape so that no contact reactions can take place and the possibly sensitive surface of the sheeting will not be damaged by friction or abrasion. The advantages of electronic coupling means become particularly significant when it is desired to give the illuminating station a large illuminating zone and the web of sheeting is required to move at a high speed.

The material of the masking tape must be selected to suit its purpose (endless web, reel to reel, direct contact with the sheeting or discrete from the sheeting), radiation source (wavelength permeability) and type of light used (polarized; in which case the base should not have a polarizing function or should have a defined degree of double refraction).

It is advantageous when the masking tape has a patterned region which is repeated once or several times. By this means it is theoretically possible to provide an unlimitedly large illuminating zone. By enlarging the illuminating zone it is possible to increase the speed of the sheeting and thus to increase the processing rate.

As regards the design of the masking tape a number of different possibilities have proven to be advantageous. For example, it is possible for the masking tape to have partially designed areas showing transparent, absorptive, and/or reflective properties. Examples of absorptive masks are black masks or printed masks. Furthermore, it is possible for the masking tape to have partially designed areas showing different optical refractive indices. Again, it is possible for the masking tape to have partially designed areas showing different polarization characteristics. It is, of course, also possible for the masking tape to have partially designed areas showing both transparent and reflective properties, different optical refractive indices, and different polarization characteristics. By means of such a masking tape it may then be possible to carry out a number of illuminating steps simultaneously using one and the same illuminating station. In order to be able to adapt the illuminating procedure precisely, the illuminating station preferably has an optical filter disposed in the optical path between the light source and the masking tape.

Furthermore, it has also been found to be advantageous to use a collimator placed in the optical path between one or more light sources and the masking tape. The use of such a collimator makes it possible to increase the distance between the masking tape and sheeting in the illuminating zone without having to accept quality losses. Other advantages may be gained by combining different filters, for example, by combining an optical band-pass filter, a collimator, and a polarizer.

It is advantageous to use a UV lamp as radiation source. Furthermore, the use of other radiation sources emitting, for example, IR radiation, EB radiation, or visible light is conceivable. It is also advantageous when the illuminating station has a screen which is shaped such that it shields the radiation of the radiation source from those areas of the film which are not in the illuminating zone. This improves the quality of the product.

The illuminating station of the invention is highly suitable for use in the manufacture of elements provided with optical security features for securing bank notes, credit cards, and the like. The illuminating station is also primarily suitable for the production of films particularly embossed films, laminated films, or sticker films.

BRIEF DESCRIPTION OF THE DRAWINGS

The invention is described below by way of example with reference to a number of embodiments illustrated by the attached drawings.

DETAILED DESCRIPTION OF THE INVENTION

Figure 1:
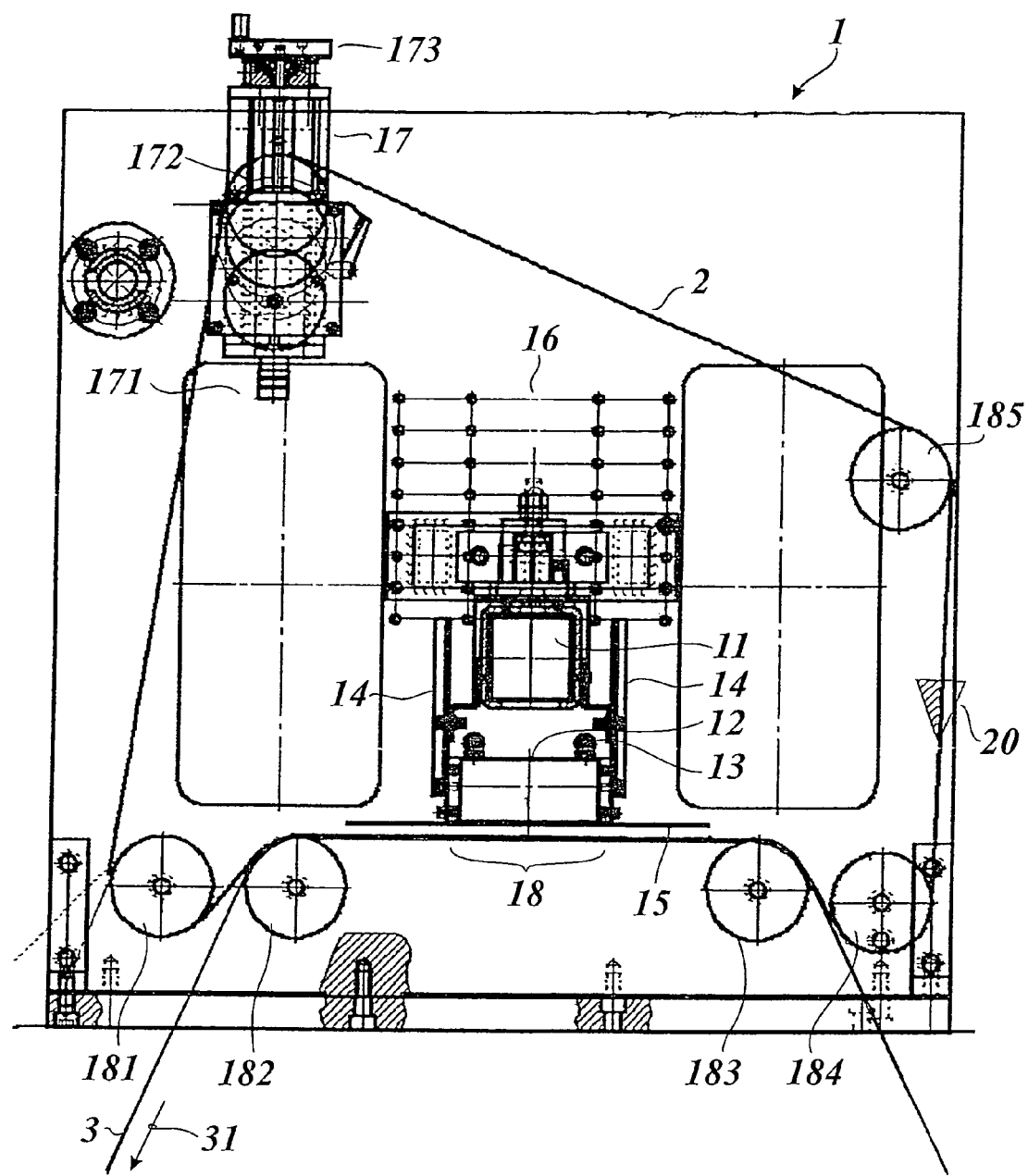
FIG. 1 is a diagrammatic representation of an illuminating station of the invention in a first embodiment.

FIG. 1 shows an illuminating station 1 having a masking tape 2, a number of rollers 181, 182, 183, 184, 185, and 172, a tensioning device 17, a shielding plate 15, a radiation source 11, a holding device 16, a filter 12, a holding device 13, and two guide rails 14.

The masking tape 2 is guided over rollers 181, 182, 183, 184, 185, and 172, as illustrated in FIG. 1. Rollers 181, 182, 183, 184, 185, and 172 thus act as guide means for guiding the masking tape 2. Instead of using rollers as guide means it is naturally also possible to guide masking tape 2 over rods, deflector plates, and guide surfaces.

Roller 172 is part of the tensioning device 17. Tensioning device 17 is connected by a screw 171 to a support for illuminating station 1. Rotation of a regulating wheel 173 makes it possible to alter the distance of the tensioning device 17 from the support of illuminating station 1 and thus to alter the position of roller 172, as shown in FIG. 1. By altering the position of roller 172 the tension of masking tape 2 is altered and thus the contact pressure between rollers 181, 182, 183, 184, 185, and 172 and masking tape 2 is changed.

Another possibility here is to provide the tensioning device with a resilient element by means of which the bearing of roller 172 is resiliency mounted. In this way it is possible to adjust the contact pressure even more precisely.

As shown in FIG. 1, the masking tape 2 is an endless web which is moved over rollers in the direction indicated by the arrow 20. Additionally, the web of sheeting 3 is guided over rollers 182 and 183 in the direction shown by the arrow 31, as indicated in FIG. 1. Accordingly, the web of sheeting 3 and masking tape 2 are guided over rollers 182 and 183 in superposed relationship so that masking tape 2 is caused, by the movement of web of sheeting 3, to travel in the same direction, as indicated by arrow 31.

Accordingly, in an illuminating zone 18, masking tape 2 and web of sheeting 3 are guided in superposed relationship and thus parallel to each other by means of rollers 182 and 183. On each side of illuminating zone 18 there are disposed rollers 182 and 183, over which the web of sheeting 3 and masking tape 2 are guided, and rollers 181 and 184, over which only masking tape 2 is guided. The arrangement of rollers 181 and 182 or 183 and 184 at the same level and the guidance of masking tape 2 and the web of sheeting 3 over these rollers in the manner shown in FIG. 1 makes it possible to adjust the contact pressure between masking tape 2 and the web of sheeting 3 along the guided path of masking tape 2 and the web of sheeting 3 over rollers 182 or 183 by means of tensioning device 17.

The contact pressure is adjusted to such an extent that sufficiently high cohesive friction is achieved between the web of sheeting 3 and masking tape 2 in the region of rollers 182 or 183 such that smooth and reliable entrainment of masking tape 2 by the web of sheeting 3 is made possible.

The holding device 16 serves to vertically adjust the position of the radiation source 11. Radiation source 11 is composed of a UV lamp, an electric socket for creating electrical contact between the lamp element and the power connection of illuminating station 1, and a screen which optically shields the lamp element on its side facing the web of sheeting 3. Instead of a UV lamp it is possible to use a radiation source emitting visible light, IR radiation, or EB radiation. This screen is preferably designed as a reflector.

Radiation source 11 is guided on a carriage in guide rails 14 such that the distance of radiation source 11 from the web of sheeting 3 can be changed. Thus radiation source 11 is not only vertically adjustable by means of holding device 16 but its distance from the web of sheeting 3 can be varied by reason of its being mounted in guide rails 14.

Filter 12 is an optical band-pass filter by means of which that frequency band can be set which has an effect on the web of sheeting. However, filter 12 may also be any other optical filter, for example, a polarization filter or a collimator. Filter 12 is fixed in a vertically adjustable position by means of holding device 13.

It is possible, of course, to dispense with filter 12 and holding device 13.

The illuminating zone 18 of illuminating station 1 has a length of from 40 to 50 cm. Alternatively, illuminating zone 18 can be made longer or shorter as the situation demands. Depending on the length of illuminating zone 18 it may be necessary to provide more than one radiation source.

Figure 2:
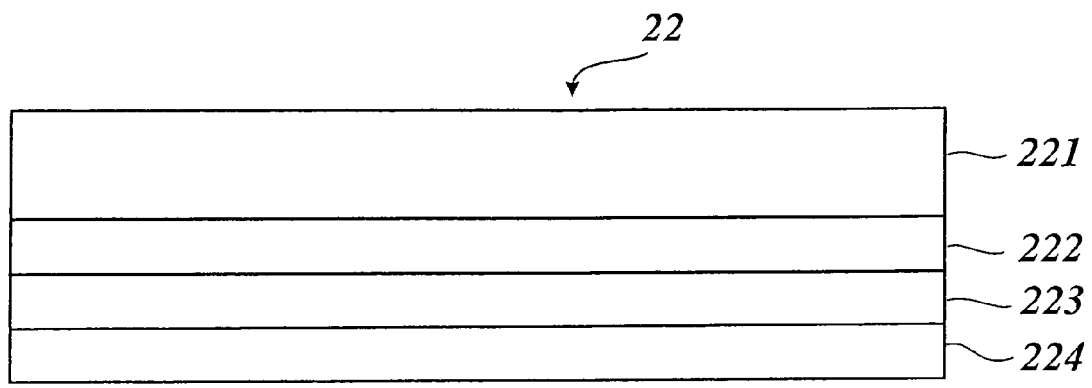
FIG. 2 is a cross-section through a masking tape for use in the illuminating station of FIG. 1.

The basic structure of masking tape 2 will now be explained with reference to FIG. 2:

FIG. 2 is a cross-section through a masking tape 22. Masking tape 22 has four layers 221, 222, 223, and 224.

Layer 221 is a base layer, which is permeable to the relevant wavelength range of radiation source 11. The base layer comprises a 50 μm thick TAC backing film that is permeable to wavelengths above 315 nm. Alternatively, use can be made of a PET base or a base of some other flexible material which is radiation-permeable in the relevant wavelength range of radiation source 11. Preferably the base should be permeable in the wavelength range of from 280 to 400 nm. Layer 221 thus consists, for example, of a 12 μm thick PET base.

Layer 222 is a replication layer preferably consisting of a transparent synthetic thermoplastic material.

The replication varnish is preferably applied by means of an intaglio drum and then dried in a drying tunnel at a temperature of from 100° to 120° C.

A texture is now embossed into replication layer 222 by means of an embossing die so that layer 222 acts as orientation layer for the subsequently applied layer 223 of an LCP material.

Apart from the use of a masking tape structure as shown in FIG. 2, in which the masking tape has partially designed areas having different polarization characteristics, is it also possible to use masking tapes which possess partially designed areas having transparent and reflective/absorptive properties or having different optical refractive indices.

Masking tapes having partially designed areas with transparent and reflective/absorptive properties are in this case composed, for example, of a base, a partially designed reflective layer and an optional layer of protective varnish. The reflective layer can in this case consist, for example, of a thin metal layer or of an HRI layer (HRI=high refraction index). The absorptive layer may be in the form of, say, a patterned colored layer.

It is, of course, also possible to use masking tapes that have areas showing different transparent/reflective/absorptive properties, different polarization characteristics and different optical refractive indices. Thus it is possible to provide, in masking tape 22, an additional partially designed reflective layer, by means of which other areas having transparent and reflective properties can be produced. In addition, it is possible to provide in a masking tape a replication layer having an embossed diffractive structure, by means of which specific optically diffractive effects, for example, enhancement and obliteration, are obtained.

Figure 3:
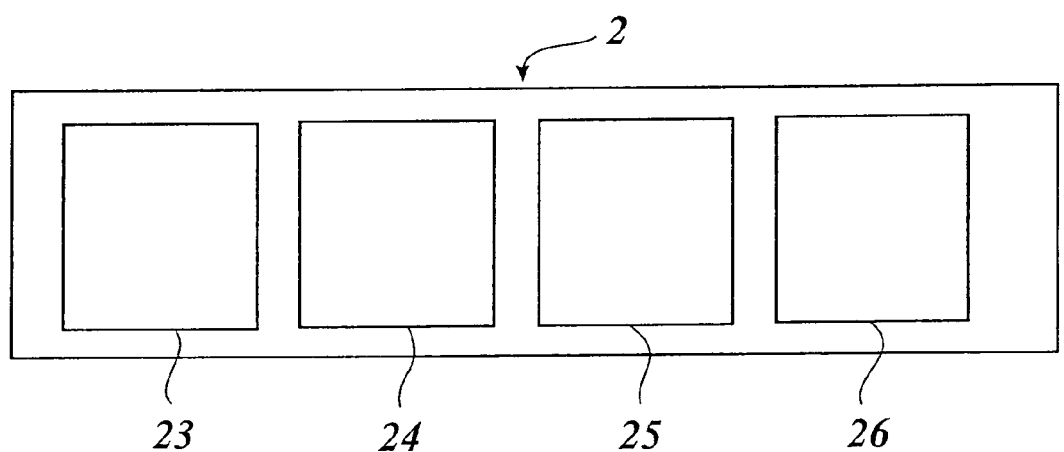
FIG. 3 is a diagrammatic top view of a masking tape for use in the illuminating station of FIG. 1.

FIG. 3 is a top view of masking tape 2 in illuminating zone 18. As may be seen from FIG. 3, masking tape 2 has a number of patterned regions 23, 24, 25, and 26. The patterns displayed by masking tape 2 are the same in each of the patterned regions 23 to 26 so that one and the same pattern in the partially designed areas having various optical properties is repeated in each of patterned regions 23 to 26.

Patterned region 23 consists, for example, of four areas, in which masking tape 2 shows different optical properties.

In a first area 231, the incident light coming from radiation source 11 is linearly polarized at an angle of 45° to the vertical, in a second area it is linearly polarized at an angle of 80° to the vertical, in a third area it is linearly polarized in the vertical direction, and in a fourth area 234 it is linearly polarized at an angle of 135° to the vertical.

The four areas can be designed to have the form of pictures, graphical representations, numerals, or alphabetic characters.

Figure 4:
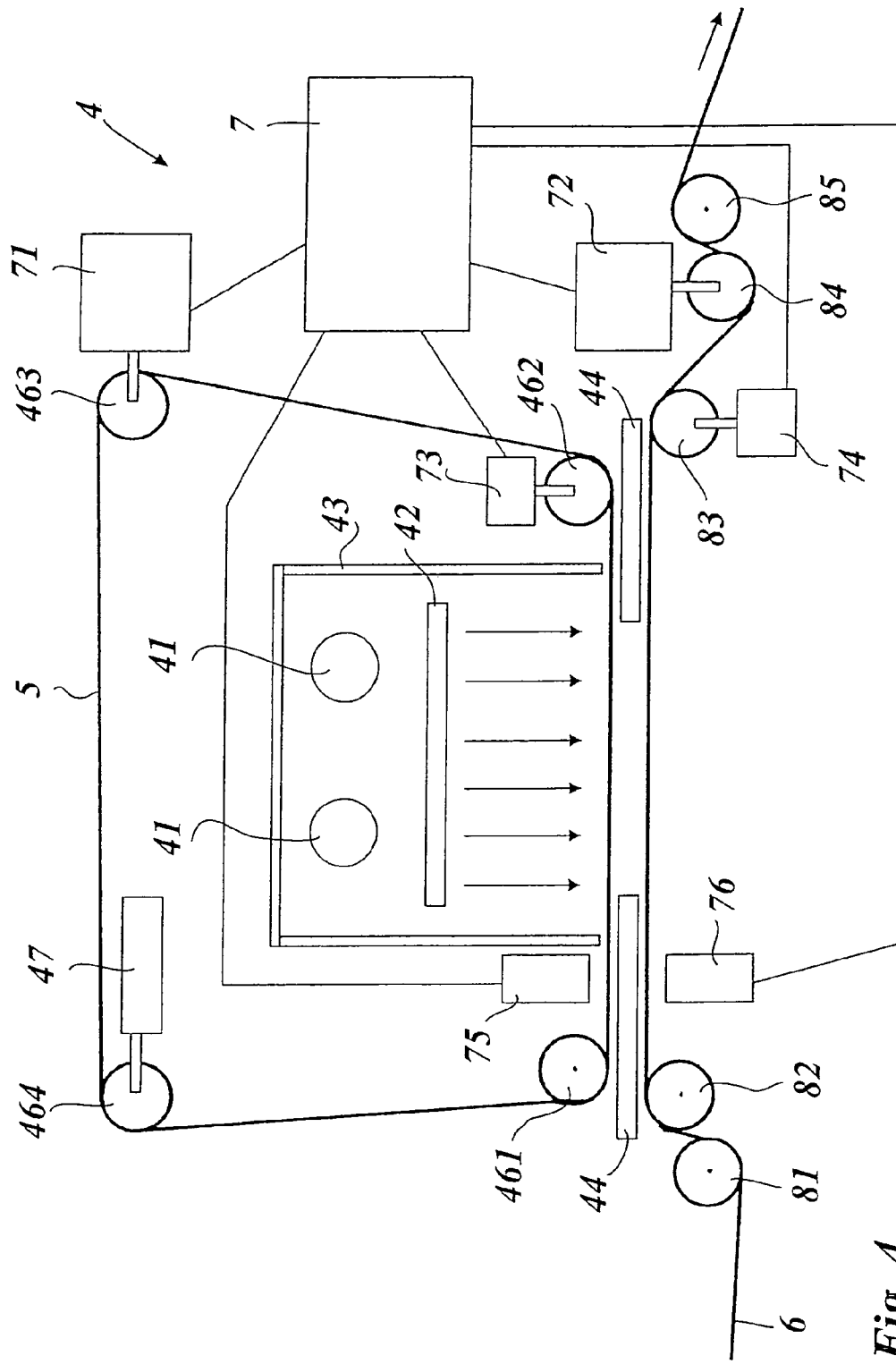
FIG. 4 is a diagrammatic representation of an illuminating station of the invention according to a second embodiment of the invention.

Further possibilities of the structure of an illuminating station of the invention will now be explained with reference to FIG. 4:

FIG. 4 is a diagrammatic representation of an illuminating station 4 having a masking tape 5, a number of rollers 464, 463, 462, and 461 for guiding the masking tape, two radiation sources 41, a shielding housing 43, a collimator 42, a tensioning device 47, two driving systems 71 and 72, a number of sensors 75, 73, 76, and 74, control means 7, a number of rollers 81, 82, 83, 84, and 85 for guiding the web of sheeting 6, and two shielding plates 44.

As shown in FIG. 4, masking tape 5 and web of sheeting 6 are no longer superposed in contact with each other in the illuminating zone but are at a distance from each other in this zone. The distance of masking tape 5 from the web of sheeting 6 in the illuminating zone is here ca 1 cm, but it can vary over a range of from a fraction of a millimeter to several centimeters. The decisive factor is the quality of collimator 42.

Shielding housing 43 and shielding plates 44 ensure that the radiation from radiation sources 41 is not allowed to reach those areas of the web of sheeting 6 which are not in the illuminating zone.

Masking tape 5 is guided over rollers 461, 462, 463, and 464. Roller 464 is linked to tensioning device 47, which, for example, may be in the form of a resilient element or of a tensioning device similar to tensioning device 17 shown in FIG. 1. Roller 463 is connected to driving system 71 such that masking tape 5 is caused to travel in the direction of the arrow by reason of the rotation of roller 463 imparted by driving system 71. Driving system 71 is, for example, an electric motor that is connected to roller 463 via transmission gearing. Roller 462 is linked to a sensor 73, which may, for example, be an incremental transmitter unit that converts the rotation of roller 462 into voltage pulses.

The web of sheeting 6 is guided over rollers 81, 82, 83, 84, and 85. Roller 84 is in this case coupled to driving system 72. Driving system 72 is, for example, an electric motor connected to roller 64 via a cog belt transmission. Rotation of roller 84 causes the web of sheeting 6 to travel in the direction of the arrow. Roller 83 is linked with sensor 74, which is likewise an incremental transmitter unit, which converts the rotary movement of roller 83 into voltage pulses.

Furthermore, the illuminating station has optical sensors 75 and 76, by means of which optical markings applied to masking tape 5 and web of sheeting 6 are registered. Sensors 75 and 76 may be omitted, if desired.

Control means 7 controls and regulates the illuminating procedure carried out by illuminating station 4. Control means 7 is linked to driving systems 71 and 72 and to sensors 75, 76, 73 via control lines.

Control means 7 registers, via sensors 73 and 74, the direction of motion and the speed of masking tape 5 and the direction of motion and the speed of the web of sheeting 6. Thus the voltage pulses delivered by sensors 73 and 78 are employed to calculate the direction of rotation and the position and speed of masking tape 5 and of the web of sheeting 6 respectively. It then controls, by means of an electronic feedback control system, driving systems 71 and 74 in such a manner that masking tape 5 and the web of sheeting 6 are moved in the illuminating zone at the same speed and in the same direction.

In this case it is possible to achieve that the web of sheeting or the masking tape travels at a given speed, whilst the speed of the other web, ie the masking tape or the web of sheeting respectively, is synchronized therewith. An alternative possibility is that the speed of the web of sheeting is determined by some other control means, which also controls driving system 72. In this case, control means 7 only specifies the speed of the web of sheeting 6 and the speed of masking tape 5 and then accordingly controls driving system 71 so as to achieve synchronization of the two speeds.

It is, of course, possible to dispense with the arrangement of a driving system 72 in illuminating station 4, if desired.

Furthermore, mechanical coupling of the rollers 463 and 84 is possible so that the driving systems 71 and 72 can be dispensed with or these two driving systems can be replaced by a single driving system.

By means of optical sensors 75 and 76, markings on masking tape 5 and on the web of sheeting 6 are recognized, these giving exact details on the position of masking tape 5 or the web of sheeting 6.

By reason of the electrical signals delivered by sensors 75 and 76, it is possible for control means 7 to determine the exact, absolute position of masking tape 5 and the web of sheeting 6 relative to each other and thus to ascertain whether the illumination is carried out in register or not. Control means 7 determines whether such deviations exist and then controls driving system 71 accordingly, in order to alter the position of masking tape 5 relatively to the web of sheeting 6 in such a manner that the illumination is again carried out in register. In this respect control means 7 and sensors 75 and 76 act as an insetting system, which alters the position of masking tape 5 relatively to the web of sheeting 6 in such a manner that illumination is carried out in register.

Of course, this function of control means 7 and sensors 75 and 76 may be dispensed with, if desired.

Figure 5:
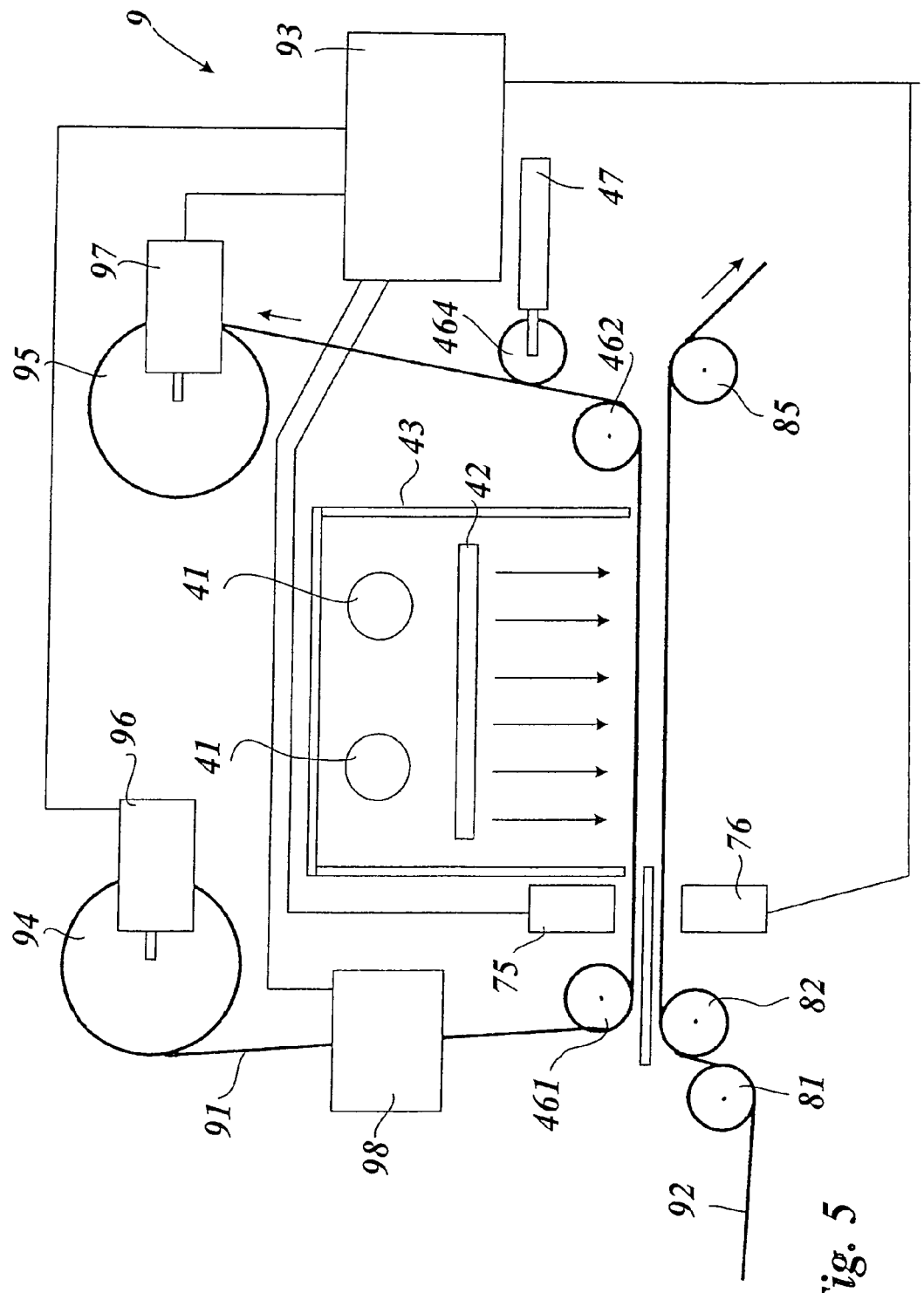
FIG. 5 is a diagrammatic representation of an illuminating station of the invention according to a third embodiment of the invention.

Further possibilities of the structure of an illuminating station of the invention will now be explained with reference to FIG. 5:

FIG. 5 is a diagrammatic representation of an illuminating station 9 having a masking tape 91, rollers 464, 462, and 461 for guiding the masking tape, two radiation sources 41, a shielding housing 43, a collimator 42, a tensioning device 47, two driving systems 96 and 97, sensors 75 and 76, control means 91, rollers 81, 82, and 85 for guiding the web of sheeting 92, two reels 94 and 95 for take-off and take-up of masking tape 91 respectively, and a digital printing device 98.

As shown in FIG. 5, masking tape 91 is not an endless web but an open masking tape which is guided from a first reel 94 supplying the masking tape to a second reel 95 receiving the masking tape.

The web of sheeting 92 is guided over rollers 81, 82, and 85. The web of sheeting 92 is in this case moved in the direction of the arrow by a driving system not shown in FIG. 5.

Masking tape 91 is guided over rollers 461, 462, and 464 from reel 94 to reel 95. Roller 464 is linked to tensioning device 47, which, for example, may be in the form of a resilient element or of a tensioning device similar to tensioning device 17 shown in FIG. 1. Reels 94 and 95 are coupled to driving systems 96 and 97 respectively, which are controlled by control means 93 and move the masking tape in the direction of the arrow. Control means 93 synchronizes in this case driving systems 96 and 97 so that masking tape 91 is moved at a constant speed. Alternatively, driving system 96 may be dispensed with or some other roller provided which is driven by a driving system and moves masking tape 91 in a manner corresponding to driving system 73 shown in FIG. 4. Furthermore, is it also possible to couple masking tape 91 with the web of sheeting 92 in the manner shown in FIG. 1.

Furthermore, the illuminating station has optical sensors 75 and 76, by means of which optical markings applied to masking tape 91 and to the web of sheeting 92 are registered.

Control means 93 controls and regulates the illuminating procedure carried out by illuminating station 9. Control means 93 is connected to driving systems 96 and 97 and to sensors 75 and 76 via control lines. By means of sensors 75 and 76 it is possible to determine the direction of motion and the speed of masking tape 91 or the direction of motion and the speed of the web of sheeting 92 and also the phase relation of masking tape 91 relative to the web of sheeting 92. The speed of the web of sheeting 92 and of masking tape 93 form the input variables of an electronic feedback control system regulating driving systems 96 and 97, which control system ensures that masking tape 91 is caused to travel through the illuminating zone at the same speed and in the same direction as the web of sheeting 92. The phase relation of masking tape 91 relative to web of sheeting 92 serves as an input variable for another feedback control system, which constantly synchronizes the phase relation of masking tape 91 with the phase relation of the web of sheeting 92 so that illumination is carried out in register.

The digital printing device 98 serves to print the masking tape 91 with one or more personalized patterned regions. For example, printing device 98 prints masking tape 91 with, say, a pattern of ink which absorbs the light radiated by lamps 41, in the manner of laser printing. The structure of masking tape 91 can correspond to the structure depicted in FIGS. 2 and 3. Patterned regions preformed on masking tape 91 can in this case be overprinted with personalizing patterned regions applied by printing device 98.

Instead of printing masking tape 91 is it also possible to partially discolor the masking tape by means of a laser for personalization purposes.

Printing device 98 is, of course, optional. Furthermore, it is possible to use printing device 98 in the illuminating stations depicted in FIG. 1 and FIG. 4, if desired, and to remove the printed ink from the masking tape following illumination.

What is claimed is:

1. An illuminating station for the manufacture of partially designed areas in one or more layers of a web of sheeting, comprising one or more radiation sources for illuminating said web of sheeting; a masking tape having partially designed areas showing different optical properties; and two or more guide means for guiding said masking tape and/or for guiding said web of sheeting, these being disposed such that said masking tape is guided through an illuminating zone in the path of radiation between said one or more radiation sources and said web of sheeting, and said illuminating station has coupling means for causing said masking tape to travel through said illuminating zone at the same speed as that of said web of sheeting, wherein said masking tape has a base layer of a material which is permeable to the radiation of said one or more radiation sources, and wherein said masking tape has at least one of
   a) partially designed areas showing different optical refractive indices,
   b) partially designed areas showing different polarization properties, and
   c) partially designed areas showing different reflective properties.

2. An illuminating station as defined in claim 1, further comprising an insetting system which adjusts the position of said masking tape relatively to said web of sheeting in such a manner that the illumination is carried out in register.

3. An illuminating station as defined in claim 1, further comprising a tensioning device for tensioning said masking tape.

4. An illuminating station as defined in claim 1, wherein said coupling means is in the form of at least one roller, over which said web of sheeting and said masking tape are guided in superposition such that said masking tape is caused to travel together with said web of sheeting.

5. An illuminating station as defined in claim 4, wherein said coupling means comprises two rollers disposed on each side of said illuminating zone for guiding said web of sheeting and said masking tape and two rollers disposed on each side of said illuminating zone for guiding said masking tape and for producing a contact pressure between said masking tape and said web of sheeting.

6. An illuminating station as defined in claim 1, further comprising a driving system for causing said masking tape to travel at a first speed, wherein said coupling means is in the form of control device which regulates a driving system, which control device synchronizes the first speed with the speed of said web of sheeting.

7. An illuminating station as defined in claim 1, wherein said masking tape is an endless web.

8. An illuminating station as defined in claim 1, wherein said masking tape is an open web, which is guided from a first reel supplying said masking tape to a second reel receiving said masking tape.

9. An illuminating station as defined in claim 1, wherein said masking tape exhibits one or more personalized patterned regions.

10. An illuminating station as defined in claim 1, wherein said masking tape is a rewritable masking tape.

11. An illuminating station as defined in claim 1, wherein said masking tape has a patterned region which is repeated once or a number of times.

12. An illuminating station as defined in claim 1, wherein said masking tape has partially designed areas showing at least one of transparent, absorptive, and reflective properties.

13. An illuminating station as defined in claim 1, wherein in the case of item b), said masking tape has an area in which the direction of polarization in which incident light is polarized changes continually.

14. An illuminating station as defined in claim 1, wherein in the case of item b), said masking tape has adjacent areas in which the direction of polarization in which incident light is polarized is different.

15. An illuminating station as defined in claim 1, wherein in the case of item b), said masking tape has adjacent areas in which the incident light is polarized and nonpolarized respectively.

16. An illuminating station as defined in claim 1, further comprising an optical filter, particularly a polarizer and/or band-pass filter, positioned in the optical path between said one or more light sources and said masking tape.

17. An illuminating station as defined in claim 1, further comprising a collimator positioned in the optical path between said one or more light sources and said masking tape.

18. An illuminating station as defined in claim 1, wherein said radiation source is a radiation sources, particularly a UV lamp.

19. An illuminating station as defined in claim 1, further comprising a screen that is shaped such that it shields the radiation of said radiation source from those areas of said web of sheeting which are not in said illuminating zone.

20. A method of using an illuminating station as defined in claim 1 for the production of an optically variable security element having partially designed areas showing different optical properties.

21. A method as defined in claim 20, wherein said optically variable element is an optical security element for securing bank notes, and credit cards.

22. A method as defined in claim 20, wherein said optically variable element is a film, particularly an embossed film, laminated film, or sticker film.

* * * * *